United States Patent
Kwon et al.

(10) Patent No.: US 8,680,767 B2
(45) Date of Patent: Mar. 25, 2014

(54) FLAT PANEL DISPLAY APPARATUS, MOTHER SUBSTRATE FOR FLAT PANEL DISPLAY APPARATUSES, METHOD OF MANUFACTURING THE FLAT PANEL DISPLAY APPARATUS, AND METHOD OF MANUFACTURING THE MOTHER SUBSTRATE

(75) Inventors: Oh-Seob Kwon, Yongin (KR); Sung-Soo Koh, Yongin (KR); Jae-Sang Ro, Seoul (KR); Seog-Young Lee, Seoul (KR); Won-Eui Hong, Seoul (KR)

(73) Assignees: Samsung Display Co., Ltd., Yongin, Gyeonggi-Do (KR); Ensil Tech Co., Ltd., Seoul (KR)

( * ) Notice: Subject to any disclaimer, the term of this patent is extended or adjusted under 35 U.S.C. 154(b) by 254 days.

(21) Appl. No.: 13/064,808

(22) Filed: Apr. 18, 2011

(65) Prior Publication Data

US 2011/0304969 A1    Dec. 15, 2011

(30) Foreign Application Priority Data

Jun. 15, 2010   (KR) ........................ 10-2010-0056752

(51) Int. Cl.
*H01L 51/50* (2006.01)
*H01L 51/52* (2006.01)
*H01L 51/56* (2006.01)

(52) U.S. Cl.
USPC ........... 313/512; 313/506; 445/25; 315/169.3

(58) Field of Classification Search
USPC ........... 313/498–512; 445/24–25; 257/40, 72, 257/98–100, 642–643, 759; 427/66, 427/532–535, 539; 438/26–29, 34, 82; 315/169.1, 169.3
See application file for complete search history.

(56) References Cited

U.S. PATENT DOCUMENTS

| 8,298,033 | B2 * | 10/2012 | Kim | 445/25 |
|---|---|---|---|---|
| 2005/0157374 | A1 * | 7/2005 | Tarn | 359/291 |
| 2007/0096631 | A1 * | 5/2007 | Sung et al. | 313/498 |
| 2007/0170861 | A1 * | 7/2007 | Lee et al. | 313/512 |
| 2009/0218320 | A1 | 9/2009 | Wang | |
| 2009/0218932 | A1 | 9/2009 | Wang | |
| 2013/0125516 | A1 | 5/2013 | Bayne et al. | |

FOREIGN PATENT DOCUMENTS

| JP | 05-92955 U | 12/1993 |
|---|---|---|
| JP | 09-189914 | 7/1997 |
| JP | 2000-138030 | 5/2000 |

(Continued)

OTHER PUBLICATIONS

Korean Notice of Allowance dated Jul. 19, 2012.

*Primary Examiner* — Nimeshkumar Patel
*Assistant Examiner* — Jose M Diaz
(74) *Attorney, Agent, or Firm* — Lee & Morse, P.C.

(57) ABSTRACT

A flat panel display apparatus includes a substrate; a display unit disposed on the substrate; a sealing substrate disposed to face the display unit; a sealing member disposed between the substrate and the sealing substrate to surround the display unit; a wiring unit disposed between the substrate and the sealing substrate, including a region that overlaps the sealing member, and including a plurality of wiring members that are spaced apart from each other in at least a portion of the region that overlaps the sealing member; and a lead-in unit connected to the wiring unit to apply a voltage to the wiring unit, and formed to be electrically connectable to an external power source.

5 Claims, 11 Drawing Sheets

(56) References Cited

FOREIGN PATENT DOCUMENTS

| | | |
|---|---|---|
| JP | 2000-252058 | 9/2000 |
| JP | 2001-222016 | 8/2001 |
| JP | 2002-244120 | 8/2002 |
| JP | 2004-061548 | 2/2004 |
| JP | 2007-279096 | 10/2007 |
| JP | 2008-527655 | 7/2008 |
| KR | 10-2001-0109011 A | 12/2001 |
| KR | 10 2001-0111846 A | 12/2001 |
| KR | 10-2002-0009498 A | 2/2002 |
| KR | 10-2003-0080895 A | 10/2003 |
| KR | 10-2006-0028212 A | 3/2006 |
| KR | 10-2006-0079615 A | 7/2006 |
| KR | 10-2007-0038312 A | 4/2007 |
| KR | 10-2007-0050767 A | 5/2007 |
| KR | 10-0761162 B2 | 9/2007 |
| KR | 10-0840090 | 6/2008 |

\* cited by examiner

FLAT PANEL DISPLAY APPARATUS, MOTHER SUBSTRATE FOR FLAT PANEL DISPLAY APPARATUSES, METHOD OF MANUFACTURING THE FLAT PANEL DISPLAY APPARATUS, AND METHOD OF MANUFACTURING THE MOTHER SUBSTRATE

BACKGROUND

1. Field

Embodiments relate to a flat panel display apparatus, a mother substrate for flat panel display apparatuses, a method of manufacturing the flat panel display apparatus, and a method of manufacturing the mother substrate, and more particularly, to a flat panel display apparatus capable of improving sealing characteristics, a mother substrate for flat panel display apparatuses, a method of manufacturing the flat panel display apparatus, and a method of manufacturing the mother substrate.

2. Description of the Related Art

Currently, many existing display apparatuses are replaced by flat panel display apparatuses that are portable and thin. In particular, flat panel display apparatuses such as organic light emitting display apparatuses and liquid crystal display apparatuses appeal to people due to their excellent image quality.

In a flat panel display apparatus, a display unit is disposed on a substrate, and a sealing substrate is disposed on the display unit to protect the display unit. Also, a sealant is disposed between the substrate and the sealing substrate.

Meanwhile, for convenience in manufacturing a plurality of flat panel display apparatuses, a mother substrate in which a plurality of display units and sealing members are formed between a substrate and a sealing substrate may be formed and then the mother substrate may be cut into units of the display units to form individual flat panel display apparatuses, each including one of the display units.

When a flat panel display apparatus is sealed to protect a display unit from external moisture, gas, and other impurities, the quality of the flat panel display apparatus highly depends on its sealing characteristics.

Sealing characteristics are determined according to a sealing substrate and a sealant. The sealant may not be easily formed and thus improvement in sealing characteristics is restrictive.

SUMMARY

Aspects of the present invention provide a flat panel display apparatus capable of easily improving sealing characteristics, a mother substrate for flat panel display apparatuses, a method of manufacturing the flat panel display apparatus, and a method of manufacturing the mother substrate.

At least one of the above and other features and advantages may be realized by providing a flat panel display apparatus including a substrate, a display unit disposed on the substrate, a sealing substrate disposed to face the display unit, a sealing member disposed between the substrate and the sealing substrate to surround the display unit, a wiring unit disposed between the substrate and the sealing substrate, including a region that overlaps the sealing member, and including a plurality of wiring members that are spaced apart from each other in at least a portion of the region that overlaps the sealing member, and a lead-in unit connected to the wiring unit to apply a voltage to the wiring unit, and formed to be electrically connectable to an external power source.

The wiring unit including the spaced-apart wiring members and the sealing member may be substantially equal in width.

The wiring members may be formed to be spaced apart from each other in the entire wiring unit.

The wiring members may be connected to the lead-in unit, and some of the wiring members may include bent portions connected to the lead-in unit.

The wiring unit may surround the display unit such that corner regions of the wiring unit are formed, and the wiring members may be formed to be spaced apart from each other in at least the corner regions of the wiring unit.

The lead-in unit may include a plurality of lead-in members connected to the plurality of wiring members.

The lead-in unit may be integrally formed and may be connected to ends of all of the plurality of wiring members.

The wiring unit may surround the display unit such that corner regions of the wiring unit are formed, and the lead-in unit may be connected to the wiring unit at a region between two corners of the wiring unit.

The wiring unit may surround the display unit such that corner regions of the wiring unit are formed, and the lead-in unit may be connected to the wiring unit at least one corner of the wiring unit.

The wiring unit may include a single wiring member that forms a continuous line that overlaps the sealing member, including a first wiring member portion that surrounds the display unit, and a second wiring member portion that parallels the first wiring member portion and surrounds the display unit between the first wiring member portion and the display unit.

The wiring member may further include a first bending region and a second bending region where respective ends of the first wiring member portion bend to connect to respective ends of the second wiring member portion to form the continuous line, wherein the first bending region and the second bending region are adjacent to each other, and wherein the lead-in unit is connected to the first wiring member portion.

The wiring members may be formed on the substrate, and the sealing member may be disposed on and between the wiring members.

The lead-in unit may have a width greater than the width of the wiring unit.

The wiring unit may surround the display unit such that corner regions of the wiring unit are formed, and wherein the plurality of wiring members include wiring members that curve at the corner regions.

The lead-in unit may include a first lead-in portion and a second lead-in portion, wherein the first lead-in portion and the second lead-in portion are disposed on the substrate at opposite locations with respect to the display unit. The wiring unit may include a first group of spaced apart wiring members that overlap a first portion of the sealing member and extend around the display unit in a first direction to connect with the first lead-in unit portion and the second lead-in unit portion, and a second group of spaced apart wiring members that overlap a second portion of the sealing member and extend around the display unit in a second direction to connect with the first lead-in unit portion and the second lead-in unit portion.

The sealing member may contain a frit.

The display unit may include an organic light emitting device.

At least one of the above and other features and advantages may be realized by providing a mother substrate for flat panel display apparatuses, the mother substrate including a substrate, a plurality of display units disposed on the substrate and spaced apart from each other to form a plurality of flat panel display apparatuses, a sealing substrate disposed to face the plurality of display units, a plurality of sealing members disposed between the substrate and the sealing substrate to surround the display units, a plurality of wiring units disposed between the substrate and the sealing substrate and each including a region that overlaps one of the plurality of sealing members, a connection unit containing a conductive material and for connecting neighboring wiring units in one direction, and a lead-in unit connected to the plurality of wiring units to apply a voltage to the plurality of wiring units, and formed to be electrically connectable to an external power source, wherein each of the plurality of wiring units includes a plurality of wiring members that are spaced apart from each other in at least a portion of the region that overlaps the plurality of sealing members.

The connection unit may have a width greater than the width of the plurality of wiring units.

The plurality of wiring units may surround respective display units such that corner regions of the wiring units are formed, and wherein the connection unit is connected to corner regions of adjacent ones of the plurality of wiring units.

The wiring unit may surround the display units such that corner regions of the wiring units are formed, and wherein the connection unit is connected to at least one corner region of the plurality of wiring units.

The connection unit may be bent.

The connection unit may include a plurality of connection members connected to the plurality of wiring members.

The plurality of connection members may have the same length.

The lead-in unit may include a first lead-in portion and a second lead-in portion, wherein the first lead-in portion and the second lead-in portion are disposed on the substrate at opposite locations with respect to the plurality of display units, the plurality of wiring units may include a first group of spaced apart wiring members that overlap a first portion of a respective sealing member and extend around a respective display unit in a first direction and a second group of spaced apart wiring members that overlap a second portion of a respective sealing member and extend around a respective display unit in a second direction to connect with the first lead-in unit portion and the second lead-in unit portion, and the lead-in unit and the connection unit may connect to both wiring units of the first group and wiring units of the second group.

At least one of the above and other features and advantages may be realized by providing a method of manufacturing a flat panel display apparatus including providing a substrate, a display unit disposed on the substrate, a sealing substrate disposed to face the display unit, a sealing member precursor disposed between the substrate and the sealing substrate to surround the display unit, a wiring unit disposed between the substrate and the sealing substrate, including a region that overlaps the sealing member precursor, and including a plurality of wiring members that are spaced apart from each other in at least a portion of the region that overlaps the sealing member precursor, and a lead-in unit connected to the wiring unit to apply a voltage to the wiring unit, and formed to be electrically connectable to an external power source, and forming a sealing member from the sealing member precursor by electrically connecting a power source to the lead-in unit, applying a voltage from the power source to spaced apart wiring members of the wiring unit, and melting and curing the sealing member precursor using heat generated from the wiring unit.

The sealing member precursor may contain a frit.

The wiring unit may include a single wiring member that forms a continuous line that overlaps the sealing member, including a first wiring member portion that surrounds the display unit, and a second wiring member portion that parallels the first wiring member portion and surrounds the display unit between the first wiring member portion and the display unit. The lead-in unit may be connected to the first wiring member.

At least one of the above and other features and advantages may be realized by providing a method of manufacturing a mother substrate for flat panel display apparatuses, including providing a substrate, a plurality of display units disposed on the substrate and spaced apart from each other to form a plurality of flat panel display apparatuses, a sealing substrate disposed to face the plurality of display units, a plurality of sealing member precursor regions disposed between the substrate and the sealing substrate to surround the plurality of display units, a plurality of wiring units disposed between the substrate and the sealing substrate and each including a region that overlaps the plurality of sealing member precursor regions, a connection unit containing a conductive material and that connects neighboring wiring units in one direction, and a lead-in unit connected to the plurality of wiring units to apply a voltage to the plurality of wiring units, and formed to be electrically connectable to an external power source, wherein each of the plurality of wiring units includes a plurality of wiring members that are spaced apart from each other in at least a portion of the region that overlaps the plurality of sealing member precursor regions, and forming a plurality of sealing members in the plurality of sealing member precursor regions by electrically connecting a power source to the lead-in unit, applying a voltage from the power source to the plurality of wiring units, and melting and curing the plurality of sealing member precursor regions using heat generated from the plurality of wiring units.

The plurality of sealing member precursor regions may contain a frit.

The connection unit may include a plurality of connection members connected to the plurality of wiring members, such that when the power source applies a voltage, the plurality of connection members may have the same voltage drop.

The plurality of connection members may have the same length.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0056752, filed on Jun. 15, 2010, in the Korean Intellectual Property Office, and entitled: "Flat Panel Display Apparatus, Mother Substrate for Flat Panel Display Apparatuses, Method of Manufacturing the Flat Panel Display Apparatus, and Method of Manufacturing the Mother Substrate," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
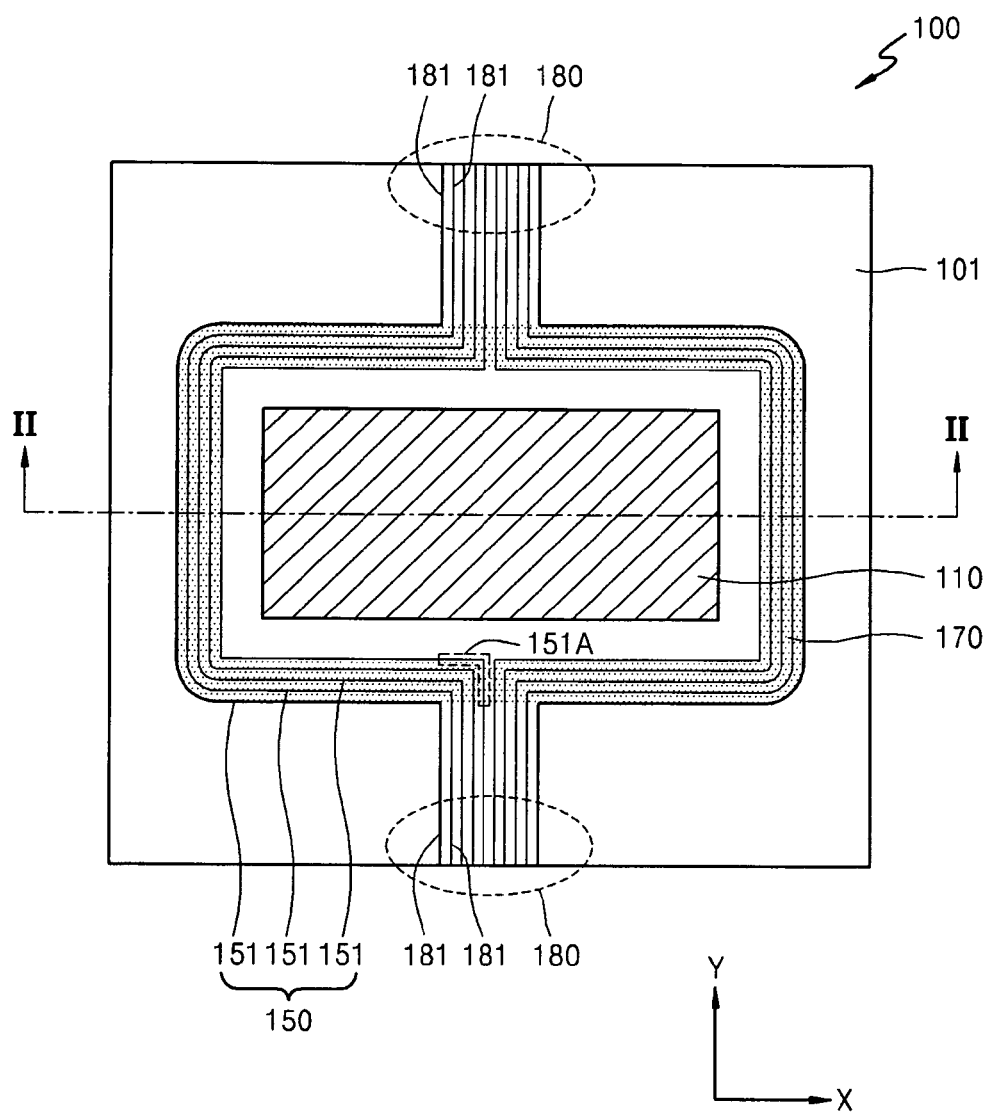
FIG. 1 illustrates a plan view of a flat panel display apparatus according to an embodiment.
Figure 2:
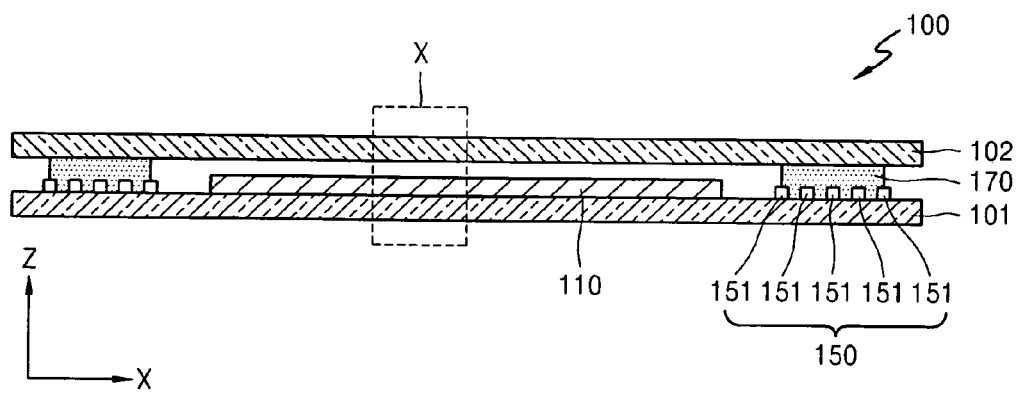
FIG. 2 illustrates a cross-sectional view taken along a line II-II illustrated in FIG. 1.
Figure 3:
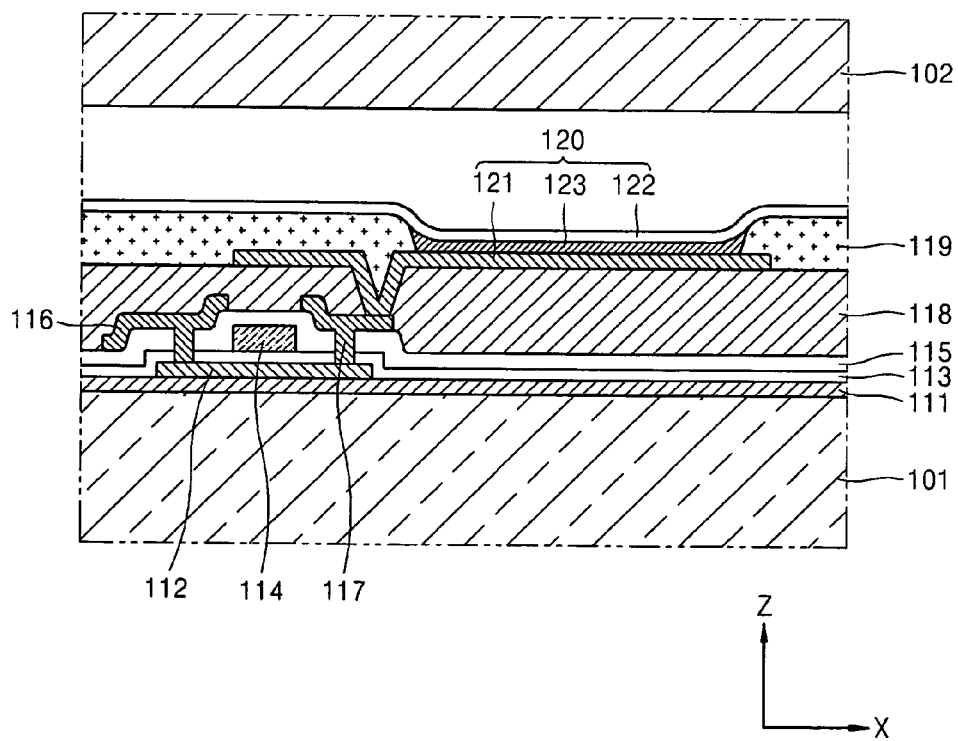
FIG. 3 illustrates a magnified view of a portion X illustrated in FIG. 2.

In the drawing figures, the dimensions of layers and regions may be exaggerated for clarity of illustration. Like reference numerals refer to like elements throughout FIG. 1 is a plan view of a flat panel display apparatus 100 according to an embodiment. FIG. 2 is a cross-sectional view taken along a line II-II illustrated in FIG. 1. FIG. 3 is a magnified view of a portion X illustrated in FIG. 2. For convenience of explanation, a sealing substrate 102 is not illustrated and a wiring unit 150 and a sealing member 170 are illustrated in FIG. 1.

Referring to FIGS. 1 through 3, the flat panel display apparatus 100 may include a substrate 101, a display unit 110, the sealing substrate 102, the wiring unit 150, the sealing member 170, and a lead-in unit 180.

In more detail, the substrate 101 may be formed of a transparent glass material that mainly contains $SiO_2$. However, the substrate 101 is not limited thereto and may be formed of a transparent plastic material. In this case, the plastic material for forming the substrate 101 may be an insulating organic material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide), polycarbonate (PC), cellulose triacetate (TAC), and cellulose acetate propionate (CAP).

The display unit 110 may be disposed on the substrate 101. The display unit 110 may have various forms. The display unit 110 may include an organic light emitting device. However, the display unit 110 is not limited thereto and may include another type of display unit such as, for example, a liquid crystal device.

The sealing substrate 102 may be disposed to face the display unit 110. The sealing member 170 may be disposed between the substrate 101 and the sealing substrate 102 to surround the display unit 110. Since a display unit 110 typically has a rectangular configuration, the sealing member 170 surrounding the display unit will typically also be formed as a rectangle. It is to be understood that other shapes of the display unit and sealing member 170 are possible. The sealing member 170 allows the substrate 101 and the sealing substrate 102 to be easily combined. The sealing member 170 may contain a frit.

The wiring unit 150 may be formed to overlap the sealing member 170. The wiring unit 150 may be formed to surround the display unit 110 along the same path that the sealing member 170 surrounds the display unit 110. The wiring unit 150 may be formed on the substrate 101, the sealing member 170 may be formed on the wiring unit 150, and the sealing substrate 102 may be disposed on the sealing member 170.

The wiring unit 150 may be a plurality of wiring members 151. The wiring members 151 may be spaced apart from each other in a region where the wiring unit 150 overlaps the sealing member 170. The wiring members 151 may be disposed to be spaced apart from each other over the entire region where the wiring members 151 overlap the substrate. The wiring unit 150 may be formed of various conductive materials.

In more detail, the wiring members 151 of the wiring unit 150 may be disposed on the substrate 101, the sealing member 170 may be disposed on and between the wiring members 151, and the sealing substrate 102 may be disposed on the sealing member 170.

The sealing member 170 may contact the substrate 101 through spaces between the wiring members 151. Accordingly, the durability of the sealing member 170 and combination characteristics between the substrate 101 and the sealing substrate 102 may be improved.

The wiring members 151 of the wiring unit 150 will now be described in more detail. When the sealing member 170 is formed, a precursor material that forms the sealing member 170 may be disposed on the sealing substrate 102, a voltage may be applied to the wiring unit 150 to generate joule heat, and the precursor material may be melted by the heat and then may be cured, thereby completely forming the sealing member 170. (For convenience of discussion, both the precursor material that forms the sealing member and the sealing member itself may be referred to as the sealing member 170.)

In this case, if the wiring unit 150 were to be integrally formed as one piece having the same width as the sealing member 170 (instead of being formed of spaced apart members according to the present embodiment), when a voltage is applied to the wiring unit 150, a center portion of the wiring unit 150 may be generally more heated than an edge portion of the wiring unit 150. Thus, an imbalance in temperature may occur between center and edge portions of the sealing member 170 with respect to the width of the sealing member 170. Thus, the center portion of the sealing member 170 may be heated to a higher temperature than the edge portions of the sealing member 170. As such, the sealing member 170 may be melted and cured unevenly, and thus the durability of the sealing member 170 may be reduced.

However, according to the current embodiment, the wiring unit 150 includes the wiring members 151 that may be spaced apart from each other in the region where the wiring unit 150 overlaps the sealing member 170. A voltage may be individually applied to the wiring members 151 and each of the wiring members 151 generates heat. Accordingly, the imbalance in temperature between the center and edge portions of the sealing member 170 may be prevented.

As shown in FIG. 1, the wiring unit 150 may be formed in a rectangular shape and may have four corners. If the wiring unit 150 were to be formed as an integrated single wiring unit, inner and outer corner regions of the wiring unit 150, i.e., corner regions relatively close to and far from the display unit 110, would have different lengths of a current path. Thus, the inner corner regions would have a shorter length of a current path than the outer corner regions and thus a current would be concentrated in the inner corner regions. Accordingly, when a voltage is applied, the amount of heat generated from the inner corner regions, i.e., regions close to the display unit 110, may be abnormally increased. Therefore, when a voltage is applied, the precursor that forms the sealing member 170 may be melted unevenly.

However, according to the current embodiment, the wiring unit 150 may include the wiring members 151, which may function as individual current paths at corner regions of the wiring unit 150. Accordingly, uneven current concentration between the inner and outer corner regions of the wiring unit 150 may be reduced or eliminated. For example, the concentration of a current in the inner corner regions of the wiring unit 150 close to the display unit 110 may be prevented and thus, when a voltage is applied, a current may flow evenly at corner regions of the wiring unit 150. As such, the sealing member 170 may be heated evenly.

According to the current embodiment, the wiring members 151 of the wiring unit 150 may have curved corners instead of angled or sharp corners. Accordingly, abnormal application of voltage at corner regions of the wiring unit 150 may be prevented more effectively. Although the inner-most wiring member 151 has angled corners in FIG. 1, the present invention is not limited thereto and the inner-most wiring member 151 may have curved corners. As such, a current may flow more evenly and easily at corner regions of the wiring unit 150.

The wiring unit 150 may have a width equal to that of the sealing member 170, or may have a width slightly greater or less than that of the sealing member 170 according to process conditions. As used herein, the term "width" of a wiring unit refers to a distance across a wiring unit in a direction perpendicular to a direction in which the individual wiring members extend.

The lead-in unit 180 may be formed to be connected to the wiring unit 150. The lead-in unit 180 may be made up of a first lead-in unit portion and a second lead-in unit portion formed at opposite sides of the wiring unit 150, such as, for example, at opposite locations with respect to the display unit 110. The wiring unit 150 may include a first group of spaced apart wiring members 151 that overlap a first portion of the sealing member and extend around the display unit in a first direction, and a second group of spaced apart wiring members 151 that overlap a second portion of the sealing member and extend around the display unit in a second direction. Both the first group and the second group of spaced apart wiring members may connect the first lead-in unit portion and the second lead-in unit portion.

In more detail, the wiring members 151 of the wiring unit 150 may be connected to the lead-in unit 180. In this case, at least the inner-most wiring member 151, i.e., the wiring member 151 that is closest to the display unit 110, may include bent portions 151A connected to the lead-in unit 180. As such, reduction in density of the wiring unit 150 that overlaps the sealing member 170 may be prevented in a region where the lead-in unit 180 meets the wiring unit 150. An abnormal region where the wiring unit 150 is not disposed on the sealing member 170 is not formed and thus generation of a region of the sealing member 170, to which a voltage is not applied and thus is not melted, may be prevented.

However, the present invention is not limited thereto. For example, the bent portions 151A may be curved. A reduction in density of the wiring unit 150 that overlaps the sealing member 170 may be effectively prevented in the region where the lead-in unit 180 meets the wiring unit 150. In order to increase the above-described effect, the rest of the wiring members 151 (that is, the wiring members 151 other than the inner-most wiring member) may also be formed to effectively prevent reduction in density of the wiring unit 150 that overlaps the sealing member 170, in the region where the lead-in unit 180 meets the wiring unit 150. The lead-in unit 180 may include a plurality of lead-in members 181 connected to the wiring members 151. Like the wiring members 151, the lead-in members 181 may be spaced apart from each other.

Figure 4:
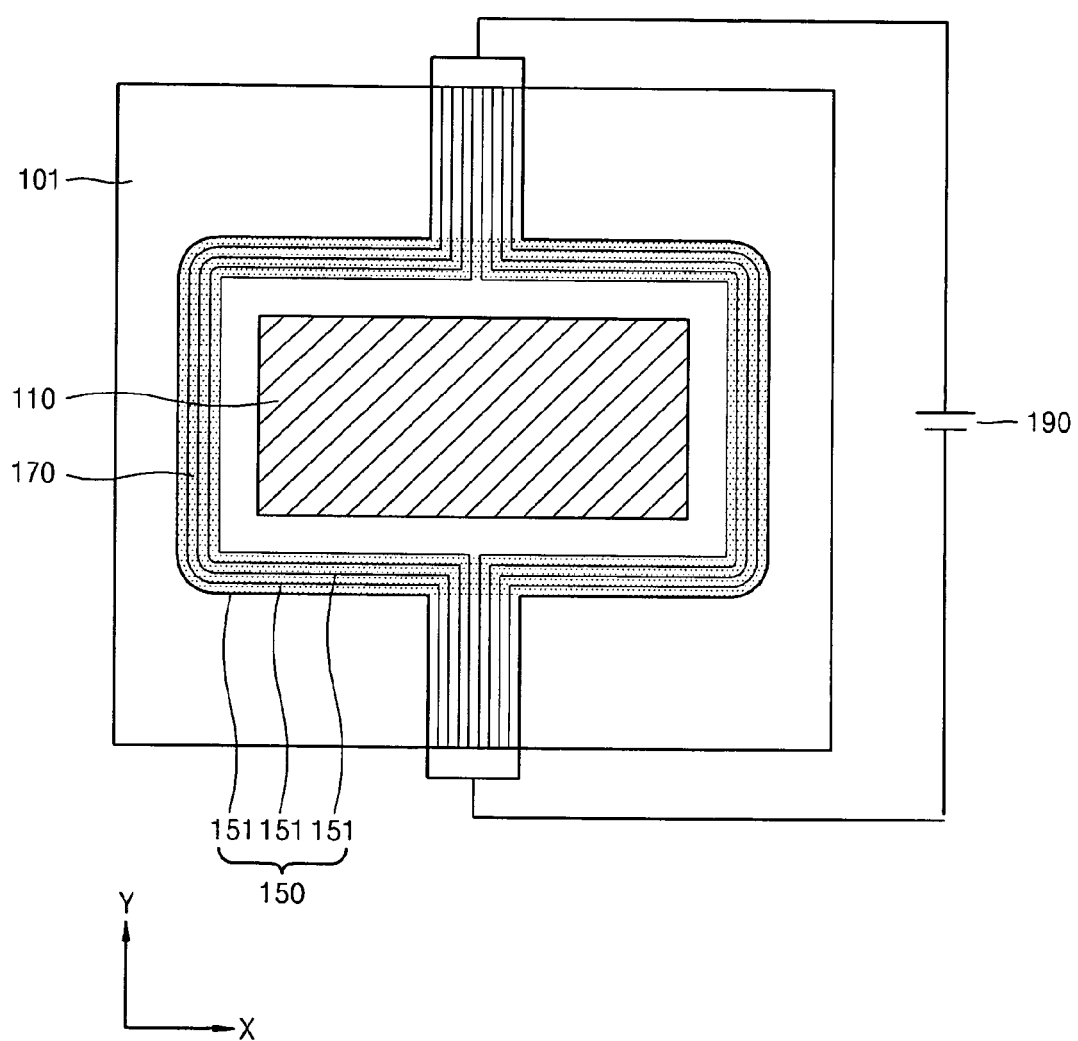
FIG. 4 illustrates a plan view showing a process of applying power to form a sealing member in a method of manufacturing the flat panel display apparatus illustrated in FIG. 1.

The lead-in unit 180 may be connected to an external power source (see, for example, power source 190 in FIG. 4). As such, a voltage may be applied to the wiring unit 150 to generate heat and a precursor of the sealing member 170 may be melted by the heat and then be cured. The lead-in unit 180 may be formed of the same material used to form the wiring unit 150.

Also, the lead-in unit 180 may have a width greater than that of the wiring unit 150. In an implementation, a sum of widths of the lead-in members 181 of the lead-in unit 180 may be greater than that of the wiring members 151. For example, where the wiring unit 150 includes a first and second group of wiring members 151 that each connect directly to a lead-in member 181, the lead-in unit 180 may have a width equal to the combined width of the first and second group of wiring members 151. As described above, in order to generate heat to form the sealing member 170, a voltage may be applied to the wiring unit 150. In this case, the voltage may be applied by the external power source via the lead-in unit 180. As such, a current flows through the wiring unit 150. In FIG. 1, a current that flows through a left side of the wiring unit 150 (that is, through the first group of wiring members 151) may meet a current that flows through a right side of the wiring unit 150 (that is, through the second group of wiring members 151) at the lead-in unit 180.

When a voltage required to generate heat for melting the precursor of the sealing member 170 is applied to the wiring unit 150, since the currents that flow through the left and right sides of the wiring unit 150 simultaneously flow through the lead-in unit 180, the lead-in unit 180 may have a load greater than that of the wiring unit 150. However, according to the current embodiment, since the lead-in unit 180 may have a width greater than that of the wiring unit 150, generation of excessive heat may be prevented. In more detail, since the lead-in unit 180 may include the lead-in members 181 connected to all of the wiring members 151 of the wiring unit 150, the number of the lead-in members 181 may be double the number of the wiring members 151 at any of the left and right sides of the wiring unit 150. As such, the amount of heat generated from the lead-in unit 180 may be similar to, or less than, that generated from the wiring unit 150.

The display unit 110 may have various forms. According to the current embodiment, the display unit 110 may be an organic light emitting device. The display unit 110 will now be described in detail with reference to FIG. 3. However, it is to be understood that other configurations and types of the display unit 110 may be used.

A buffer layer 111 may be formed on the substrate 101. The buffer layer 111 may planarize an upper surface of the substrate 101 and may prevent moisture and impurities from penetrating into the substrate 101.

An active layer 112 having a predetermined pattern may be formed on the buffer layer 111. The active layer 112 may be formed of an organic semiconductor or an inorganic semiconductor such as amorphous silicon (a-Si) or polysilicon (p-Si), and may include a source region, a drain region, and a channel region.

The source and drain regions may be formed by doping impurities on the active layer 112 formed of a-Si or p-Si. A p-type semiconductor may be formed if doped with boron (B), i.e., a Group III element, and an n-type semiconductor may be formed if doped with nitrogen (N), i.e., a Group V element.

A gate insulating layer 113 may be formed on the active layer 112, and a gate electrode 114 may be formed on a predetermined region of the gate insulating layer 113. The gate insulating layer 113 insulates the active layer 112 and the gate electrode 114 from each other and may be formed of an organic material or an inorganic material such as $SiN_x$ or $SiO_2$.

The gate electrode 114 may be formed of a metal such as gold (Au), silver (Ag), copper (Cu), nickel (Ni), platinum (Pt), palladium (Pd), aluminum (Al), or molybdenum (Mo), or a metal alloy such as Al:Nd or Mo:W. However, the gate electrode 114 is not limited thereto and may be formed of various materials in consideration of high adhesion, evenness, electric resistance, processability, etc. The gate electrode 114 may be connected to a gate line (not shown) for applying an electrical signal.

An interlayer insulating layer 115 may be formed on the gate electrode 114. The interlayer insulating layer 115 and the gate insulating layer 113 may expose the source and drain regions of the active layer 112 such that source and drain electrodes 116 and 117 may respectively contact the exposed source and drain regions of the active layer 112.

The source and drain electrodes 116 and 117 may be formed of a metal such as Au, Pd, Pt, Ni, rhodium (Rh), ruthenium (Ru), iridium (Ir), osmium (Os), Al, or Mo, or a metal alloy such as Al:Nd or MoW, but are not limited thereto.

A passivation layer 118 may be formed on the source and drain electrodes 116 and 117. The passivation layer 118 may be an inorganic insulating layer and/or an organic insulating layer. The inorganic insulating layer may contain $SiO_2$, $SiN_x$, SiON, $Al_2O_3$, $TiO_2$, $Ta_2O_5$, $HfO_2$, $ZrO_2$, BST, PZT, etc. and the organic insulating layer may contain a general purpose polymer, e.g., poly(methyl methacrylate) (PMMA) or polystyrene (PS), a polymer derivative having a phenol group, an acryl-based polymer, an imide-based polymer, an arylether-based polymer, an amide-based polymer, a fluorine-based polymer, a p-xylene-based polymer, a vinylalcohol-based polymer, a blend thereof, etc. The passivation layer 118 may be formed of a stack of the inorganic insulating layer and the organic insulating layer.

The passivation layer 118 may expose the drain electrode 117, and an organic light emitting device 120 may be connected to the drain electrode 117. The organic light emitting device 120 may include a first electrode 121, a second electrode 122, and an intermediate layer 123. In more detail, the first electrode 121 may contact the drain electrode 117.

The intermediate layer 123 may include an organic emission layer and may emit visual light if a voltage is applied by the first and second electrodes 121 and 122.

A pixel defining layer 119 may be formed on the first electrode 121 by using an insulator. A predetermined opening may be formed in the pixel defining layer 119 to expose the first electrode 121. The intermediate layer 123 may be formed on the exposed first electrode 121. Then, the second electrode 122 may be connected to the intermediate layer 123.

The first and second electrodes 121 and 122 respectively may have positive and negative polarities. The polarities of the first and second electrodes 121 and 122 may be exchanged. Thus, the first electrode 121 may have a negative polarity and the second electrode 122 may have a positive polarity.

The sealing substrate 102 may be disposed to face the second electrode 122.

FIG. 4 is a plan view showing a process of applying power to form the sealing member 170 in a method of manufacturing the flat panel display apparatus 100 illustrated in FIG. 1. The process of forming the sealing member 170 may include disposing a precursor to form the sealing member 170, and then melting and curing the precursor.

To effect the melting process, two ends of a power source 190 may be connected to the lead-in unit 180. For example, if the lead-in unit 180 is made up of a first lead-in unit portion and a second lead-in unit portion formed at two opposite sides of the wiring unit 150, respective ends of the power source may be connected to respective ones of the first lead-in unit portion and the second lead-in unit portion. Then, when a voltage is applied, joule heat is generated from the wiring unit 150. As such, the precursor material to form the sealing member 170, which overlaps the wiring unit 150, may be easily melted and then cured to form the sealing member 170. The sealing member 170 may allow the substrate 101 and the sealing substrate 102 to be easily combined.

In this case, the wiring unit 150 may include the wiring members 151 that are spaced apart from each other with respect to the width of the sealing member 170. As such, when a voltage is applied to the wiring unit 150, the heat may be evenly applied to the entire region of the sealing member 170 with respect to the width of the sealing member 170.

Consequently, a current may flow evenly at corner regions of the wiring unit 150, the sealing member precursor may be heated evenly, the sealing member precursor may be evenly melted and cured to form the sealing member 170, and thus sealing characteristics of the flat panel display apparatus 100 may be improved.

Figure 5:
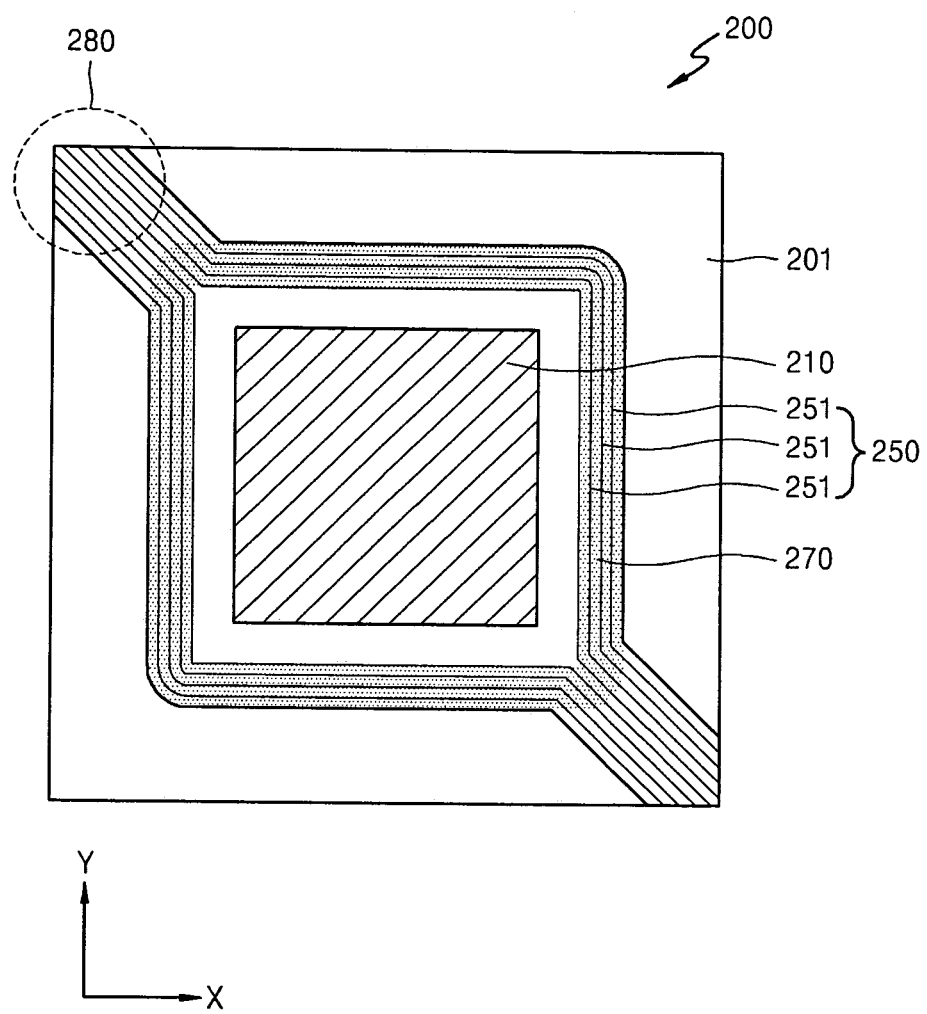
FIG. 5 illustrates a plan view of a flat panel display apparatus according to another embodiment.

FIG. 5 is a plan view of a flat panel display apparatus 200 according to another embodiment. For convenience of explanation, differences from the previous embodiment will be mainly described.

Referring to FIG. 5, the flat panel display apparatus 200 may include a substrate 201, a display unit 210, a sealing substrate (not shown), a wiring unit 250, a sealing member 270, and a lead-in unit 280.

The display unit 210 may be disposed on the substrate 201, and the sealing substrate may be disposed to face the display unit 210. The sealing member 270 may be disposed between the substrate 201 and the sealing substrate to surround the display unit 210. The wiring unit 250 may be formed to overlap the sealing member 270.

The wiring unit 250 may include a plurality of wiring members 251. The wiring members 251 may be spaced apart from each other in a region where the wiring unit 250 overlaps the sealing member 270. For example, the wiring members 251 may be disposed to be spaced apart from each other over the entire region where the wiring members 251 overlap the substrate.

In an implementation, the wiring members 251 of the wiring unit 250 may be disposed on the substrate 201, the sealing member 270 may be formed on and between the wiring members 251, and the sealing substrate may be disposed on the sealing member 270.

The lead-in unit 280 is formed to be connected to the wiring unit 250. The lead-in unit 280 includes a first lead-in unit portion and a second lead-in unit portion formed at two opposite corners of the wiring unit 250. The wiring members 251 of the wiring unit 250 may be connected to the lead-in unit 280.

The lead-in unit 280 may be disposed at corners of the wiring unit 250, when the sealing member 270 is formed.

Accordingly, a space required to dispose an external power source (not shown) may be reduced.

Also, portions of the wiring members 251, which are connected to the lead-in unit 280, may be bent. The lead-in unit 280 may be disposed at corners of the wiring unit 250, and the bent portions of the wiring members 251 may be smoothly bent. Thus, the wiring members 251 may be bent at a more gentle, obtuse angle instead of at a sharp acute angle or right angle. As such, concentration of an electric field in a region where the wiring members 251 meet the lead-in unit 280 may be prevented and heat may be evenly applied to the sealing member 270.

The lead-in unit 280 may include a plurality of lead-in members connected to the wiring members 251. Like the wiring members 251, the lead-in members may be spaced apart from each other. The lead-in unit 280 may be formed of the same material used to form the wiring unit 250. Also, the lead-in unit 280 may have a width greater than that of the wiring unit 250

The lead-in unit 280 may be connected to the external power source. As such, a voltage may be applied to the wiring unit 250 to generate heat and the sealing member precursor may be melted by the heat and then be cured to form the sealing member 270.

Figure 6:
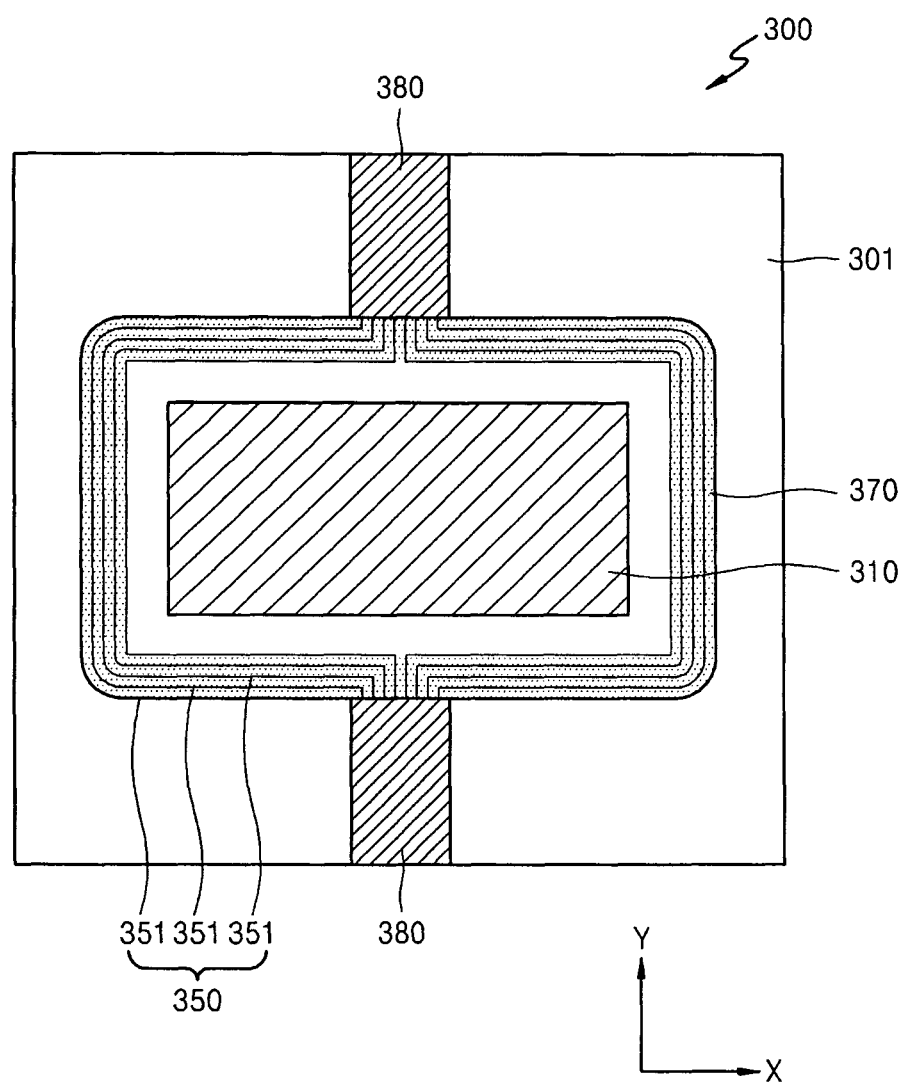
FIG. 6 illustrates a plan view of a flat panel display apparatus according to another embodiment.

FIG. 6 is a plan view of a flat panel display apparatus 300 according to another embodiment. For convenience of explanation, differences from the previous embodiments will be mainly described.

Referring to FIG. 6, the flat panel display apparatus 300 may include a substrate 301, a display unit 310, a sealing substrate (not shown), a wiring unit 350, a sealing member 370, and a lead-in unit 380.

The display unit 310 may be disposed on the substrate 301, and the sealing substrate may be disposed to face the display unit 310. The sealing member 370 may be disposed between the substrate 301 and the sealing substrate to surround the display unit 310. The wiring unit 350 may be formed to overlap the sealing member 370.

The wiring unit 350 may include a plurality of wiring members 351. The wiring members 351 may be spaced apart from each other in a region where the wiring unit 350 overlaps the sealing member 370. For this, the wiring members 351 may be disposed to be spaced apart from each other over the entire region where the wiring members 351 overlap the substrate.

In an implementation, the wiring members 351 of the wiring unit 350 may be disposed on the substrate 301, the sealing member 370 may be formed on and between the wiring members 351, and the sealing substrate may be disposed on the sealing member 370.

The lead-in unit 380 may be formed to be connected to the wiring unit 350. As in previous embodiments, the lead-in unit may include a first lead-in unit portion and a second lead-in portion disposed at opposite ends of the wiring unit 350. The lead-in unit 380 may be formed in an extended form to be integrally connected to ends of the wiring members 351 of the wiring unit 350. Thus, the lead-in unit 380 may be integrally formed. For example, each of the first lead-in unit portion and a second lead-in portion may be integrally formed to connect to respective ends of the wiring unit 350 instead of being made up of spaced apart lead-in members.

The lead-in unit 380 may be integrally formed. Accordingly, when a voltage is applied by an external power source (not shown), the voltage may be evenly applied to the lead-in unit 380. Also, the lead-in unit 380 and the wiring members 351 may be easily connected.

The lead-in unit 380 may be connected to the external power source. The lead-in unit 380 may be integrally formed in an extended form. Accordingly, the lead-in unit 380 may be stably connected to the external power source.

A voltage may be applied to the wiring unit 350 via the lead-in unit 380 to generate heat and the sealing member precursor may be melted by the heat and then be cured to form the sealing member 370. The lead-in unit 380 may be formed of the same material used to form the wiring unit 350. Also, the lead-in unit 380 may have a width greater than that of the wiring unit 350.

Figure 7:
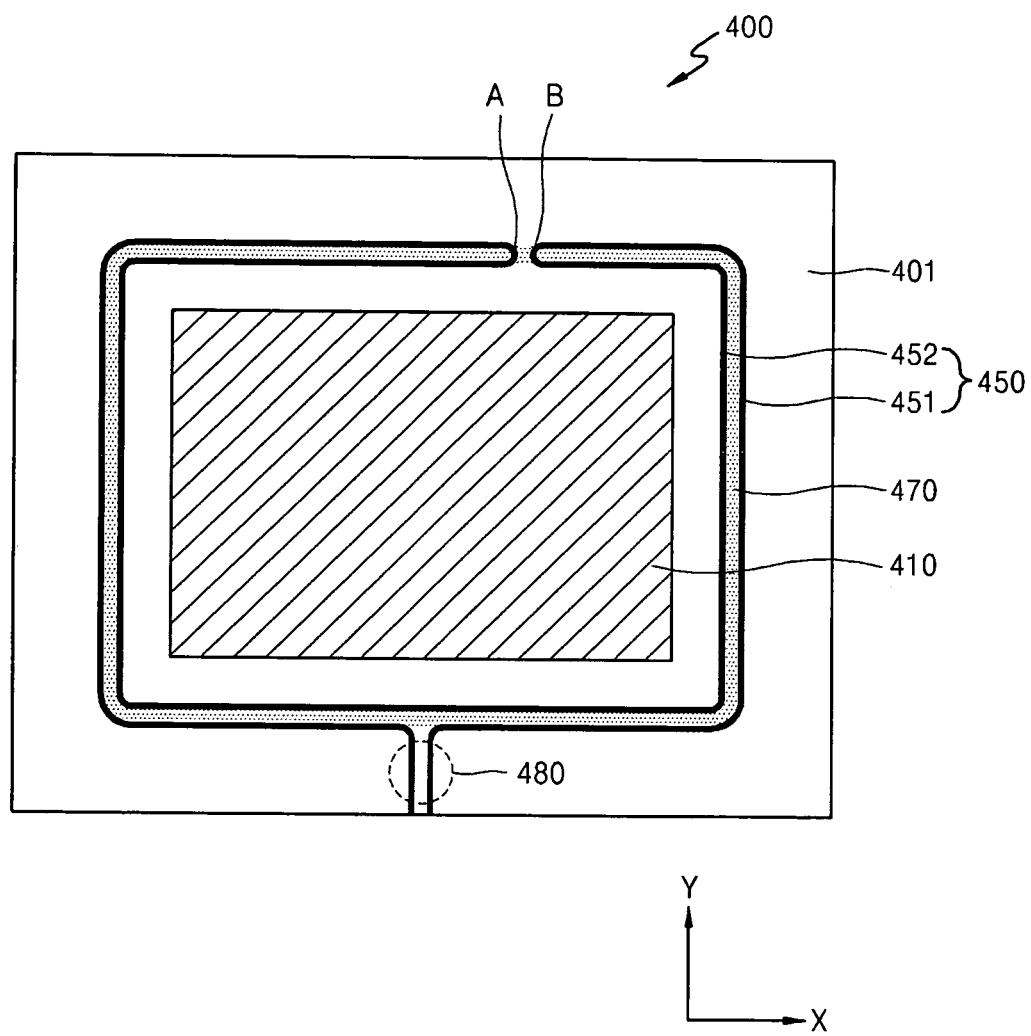
FIG. 7 illustrates a plan view of a flat panel display apparatus according to another embodiment.

FIG. 7 is a plan view of a flat panel display apparatus 400 according to another embodiment. For convenience of explanation, a sealing substrate is not illustrated and a wiring unit 450 and a sealing member 470 are illustrated in FIG. 7.

Referring to FIG. 7, the flat panel display apparatus 400 may include a substrate 401, a display unit 410, the sealing substrate, the wiring unit 450, the sealing member 470, and a lead-in unit 480.

The display unit 410 may be disposed on the substrate 401. The sealing substrate may be disposed to face the display unit 410, and the sealing member 470 may be disposed between the substrate 401 and the sealing substrate to surround the display unit 410. The sealing member 470 may contain a frit.

The wiring unit 450 may be formed to overlap the sealing member 470. The wiring unit 450 may be formed on the substrate 401, the sealing member 470 may be formed on the wiring unit 450, and the sealing substrate may be disposed on the sealing member 470.

The wiring unit 450 may be in the form of a continuous line that includes a first wiring member portion 451 and a second wiring member portion 452. The first and second wiring member portions 451 and 452 may be spaced apart from each other by a predetermined distance in a region where the wiring unit 450 overlaps the sealing member 470, and meet each other in two regions A and B.

The regions A and B, which are bending regions where the respective ends of the first and second wiring member portions 451 and 452 connect with each other, may be spaced apart from each other and may be as close as possible. As such, a region of the sealing member 470 where the wiring unit 450 is not disposed may be reduced.

The first wiring member portion 451 may be disposed outside the second wiring member portion 452. For example, the first wiring member portion 451 may be disposed farther away from the display unit 410 in comparison to the second wiring member portion 452, and the first wiring member portion 451 and second wiring member portion 452 may be parallel to each other except at the regions A and B where they connect to each other.

The first and second wiring member portions 451 and 452 of the wiring unit 450 may be disposed on the substrate 401, the sealing member 470 may be disposed on and between the first and second wiring member portions 451 and 452, and the sealing substrate may be disposed on the sealing member 470.

The wiring unit 450 may include the first and second wiring member portions 451 and 452 that are spaced apart from each other in a region where the wiring unit 450 overlaps the sealing member 470. Power may be applied to the wiring unit 450 to generate heat, and an imbalance in temperature between center and edge portions of the sealing member 470 with respect to the width of the sealing member 470 may be prevented. Also, the wiring unit 450 may have curved corners such that a current may flow evenly at the corners of the wiring unit 450 and thus generation of excessive heat at the corners may be prevented.

The lead-in unit 480 may be formed to be connected to the wiring unit 450. The lead-in unit 480 may be formed at one side of the wiring unit 450. In more detail, the first wiring member portion 451 of the wiring unit 450 may be connected to the lead-in unit 480. The first wiring member portion 451 may be made up of two segments separated from each other at the bending portions A and B where the first wiring member portion 451 bends to form the second wiring member portion 452. The end of each segment of the first wiring member portion 451 in a direction away from the bending portions A and B may be connected to the lead-in unit 480.

The lead-in unit 480 may be formed at only one side of the wiring unit 450. As such, in comparison to a case when the lead-in unit 480 is disposed at two sides of the wiring unit 450, a process may be reduced and the space of the flat panel display apparatus 400 may be efficiently used.

Figure 8:
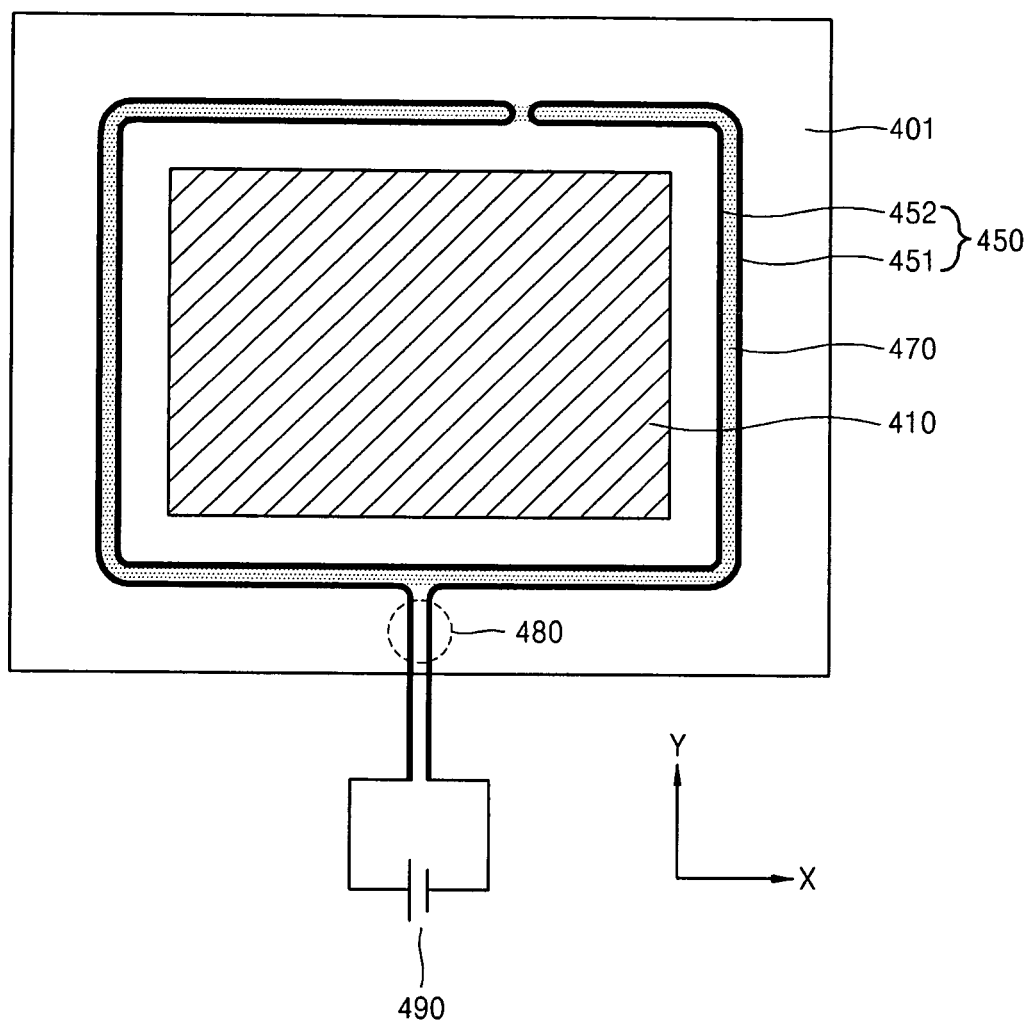
FIG. 8 illustrates a plan view showing a process of applying power to form a sealing member in a method of manufacturing the flat panel display apparatus illustrated in FIG. 7.

The lead-in unit 480 may be connected to an external power source (see, for example, power source 490 in FIG. 8). As such, a voltage may be applied to the wiring unit 450 to generate heat and the precursor material of the sealing member 470 may be melted by the heat and then be cured. The lead-in unit 480 may be formed of the same material used to form the wiring unit 450.

FIG. 8 is a plan view showing a process of applying power to form the sealing member 470 in a method of manufacturing the flat panel display apparatus 400 illustrated in FIG. 7. The process of forming the sealing member 470 may include disposing a precursor material of the sealing member 470, and then melting and curing the material.

In the melting process, two ends of a power source 490 may be connected to the lead-in unit 480. Then, when a voltage is applied, joule heat may be generated from the wiring unit 450. The precursor material to form the sealing member 470, which overlaps the wiring unit 450, may be easily melted and then cured to form the sealing member 470. The sealing member 470 may allow the substrate 401 and the sealing substrate to be easily combined.

In this case, the wiring unit 450 may include the first and second wiring member portions 451 and 452 that are spaced apart from each other in a portion of a region where the wiring unit 450 overlaps the sealing member 470. As such, when a voltage is applied to the wiring unit 450, the heat may be evenly applied to the sealing member 470 with respect to the width of the sealing member 470.

Consequently, as the sealing member 470 is evenly melted and cured, sealing characteristics of the flat panel display apparatus 400 may be improved.

Figure 9:
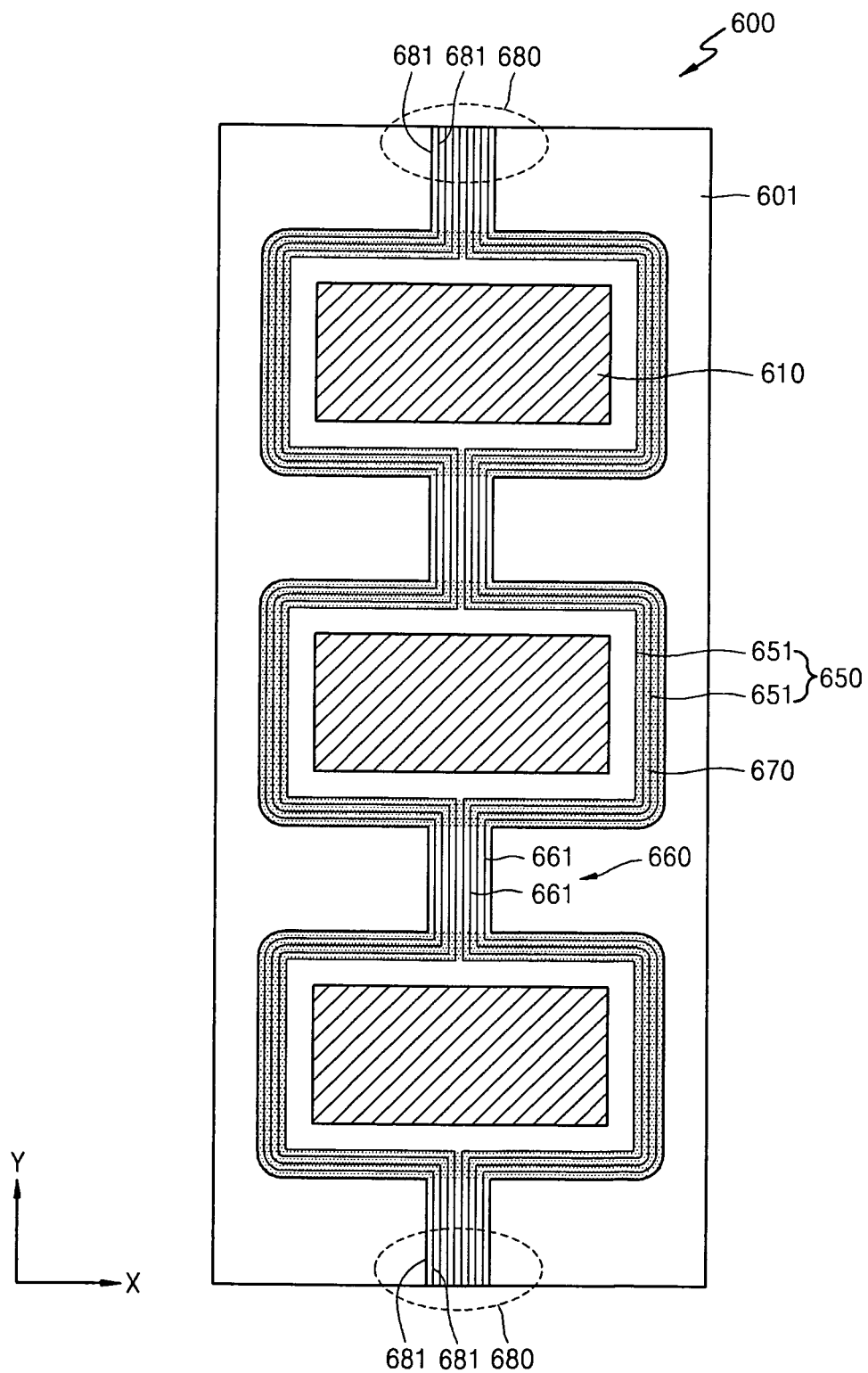
FIG. 9 illustrates a plan view of a mother substrate for flat panel display apparatuses, according to an embodiment.

FIG. 9 is a plan view of a mother substrate 600 for flat panel display apparatuses, according to an embodiment.

Referring to FIG. 9, the mother substrate 600 may include a substrate 601, a plurality of display units 610, a sealing substrate (not shown), a plurality of wiring units 650, a plurality of sealing members 670, a connection unit 660, and a lead-in unit 680.

The display units 610 may be disposed on the substrate 601. Each of the display units 610 may form a flat panel display apparatus. Since three display units 610 are illustrated in FIG. 9, three flat panel display apparatuses may be ultimately manufactured by using the mother substrate 600. However, embodiments are not limited thereto and the number of the display units 610 included in the mother substrate 600 is not restricted.

The sealing substrate may be disposed to face the display units 610. The sealing members 670 may be disposed between the substrate 601 and the sealing substrate to surround the display units 610.

The wiring units 650 may be formed to overlap the sealing members 670. For example, three wiring units 650 may be formed to correspond to three display units 610.

Each of the wiring units 650 may include a plurality of wiring members 651. The wiring members 651 may be spaced apart from each other in a region where the wiring units 650 overlap the sealing members 670. The wiring members 651 may be disposed to be spaced apart from each other over the entire region where the wiring members 651 overlap the substrate.

In an implementation, the wiring members 651 of the wiring units 650 may be disposed on the substrate 601, the sealing members 670 may be disposed on and between the wiring members 651, and the sealing substrate may be disposed on the sealing members 670.

The wiring units 650 may be disposed to overlap the sealing members 670 that surround the display units 610, and may be aligned in one direction, e.g., the Y direction. The connection unit 660 may be disposed between neighboring wiring units 650 in the one direction (the Y direction). The connection unit 660 may connect the neighboring wiring units 650. The connection unit 660 may contain a conductive material and may be formed of the same material used to form the wiring units 650.

Also, the connection unit 660 may include a plurality of connection members 661 that each connect to one of the wiring members 651 included in each of the neighboring wiring units 650.

The connection unit 660 may have a width greater than that of the wiring units 650. In an implementation, a sum of widths of the connection members 661 may be greater than that of the wiring members 651. Each wiring unit 650 may include a first group of spaced apart wiring members 651 that overlap a first portion of the sealing member and extend around the display unit in a first direction and a second group of spaced apart wiring members 651 that overlap a second portion of the sealing member and extend around the display unit in a second direction. Both the first group and the second group of spaced apart wiring members may connect a lead-in unit portion to a connection unit 660. The connection unit 660 therefore may have a width equal to the combined width of the first and second group of wiring members 651.

In order to form the sealing members 670, a voltage may be applied to the wiring units 650. The voltage may be applied by an external power source (see, for example, power source 690 in FIG. 10) via the lead-in unit 680. As such, a current may flow through each of the wiring units 650. In FIG. 9, a current that flows through a left side of each of the wiring units 650 meets a current that flows through a right side of each of the wiring units 650 at the connection unit 660.

When a voltage required to generate heat to melt the sealing members 670 is applied to the wiring units 650, the currents that flow through the left and right sides of the wiring units 650 may simultaneously flow through the connection unit 660. Thus, the connection unit 660 may have a load greater than that of the wiring units 650. According to the current embodiment, the connection unit 660 may have a width greater than that of the wiring units 650. Accordingly, generation of excessive heat may be prevented. The connection unit 660 may include the connection members 661 connected to all of the wiring members 651 of the wiring units 650, and the number of the connection members 661 may be double the number of the wiring members 651 at any of the left and right sides of the wiring units 650. As such, the amount of heat generated from the connection unit 660 may be similar to, or less than, that generated from the wiring units 650.

The lead-in unit 680 may be formed to be connected to the wiring units 650. The lead-in unit 680 may be formed at outer ends of the outer-most wiring units 650. The lead-in unit 680 may include a plurality of lead-in members 681 connected to the wiring members 651. For example, the lead-in unit 680 may include a first lead-in portion and a second lead-in portion formed at opposite ends of the substrate.

The lead-in unit 680 may be connected to the external power source. As such, a voltage may be applied to the wiring units 650 to generate heat and the sealing members 670 may be melted by the heat and then be cured. The lead-in unit 680 may be formed of the same material used to form the wiring units 650.

The lead-in unit 680 may have a width greater than that of the wiring units 650. The lead-in unit 680 may have a width equal to or greater than double the width of the wiring units 650. In an implementation, since the lead-in unit 680 may include the lead-in members 681 connected to all of the wiring members 651 of the wiring units 650. Accordingly, the number of the lead-in members 681 may be double the number of the wiring members 651 at any of the left and right sides of the wiring units 650. As such, the amount of heat generated from the lead-in unit 680 may be similar to, or less than, that generated from the wiring units 650.

Figure 10:
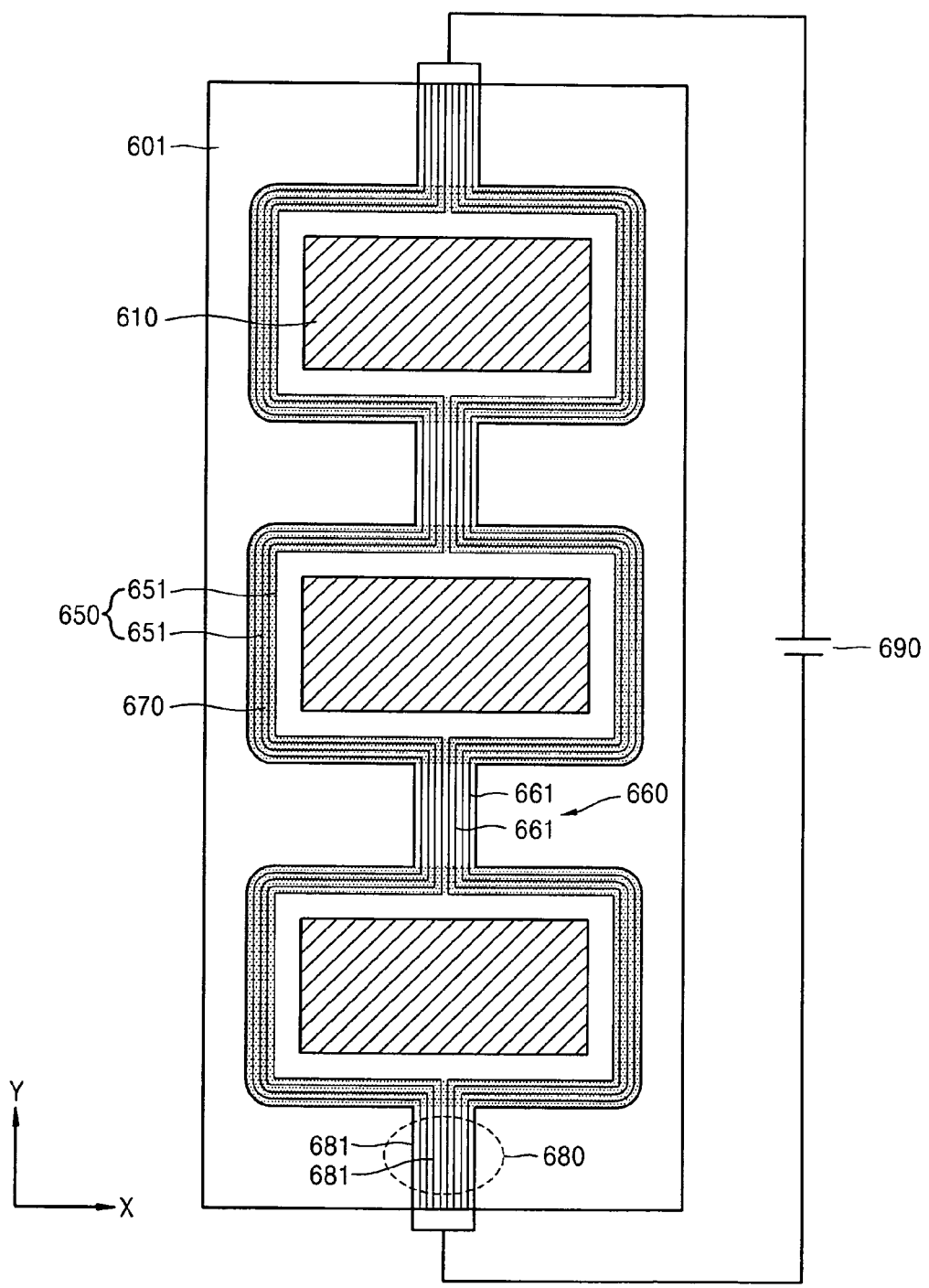
FIG. 10 illustrates a plan view showing a process of applying power to form sealing members in a method of manufacturing the mother substrate illustrated in FIG. 9.

FIG. 10 is a plan view showing a process of applying power to form the sealing members 670 in a method of manufacturing the mother substrate 600 illustrated in FIG. 9. The process of forming the sealing members 670 may include disposing a precursor material that forms the sealing members 670, and then melting and curing the precursor material.

In the melting process, two ends of a power source 690 may be connected to the lead-in unit 680. Then, when a voltage is applied, joule heat may be generated from the wiring units 650. As such, the precursor material that forms the sealing members 670, which overlaps the wiring units 650, may be easily melted and then cured to form the sealing members 670.

Each of the wiring units 650 may include the wiring members 651 that are spaced apart from each other with respect to the width of the sealing members 670. As such, when a voltage is applied to the wiring units 650, the heat may be evenly applied to the entire region of the sealing members 670 with respect to the width of the sealing members 670. Also, the wiring units 650 may be provided with rounded corners such that generation of excessive heat in inner corner regions of the wiring units 650 may be prevented.

Consequently, the sealing members 670 may be evenly melted and cured and thus sealing characteristics of the mother substrate 600 may be improved.

Figure 11:
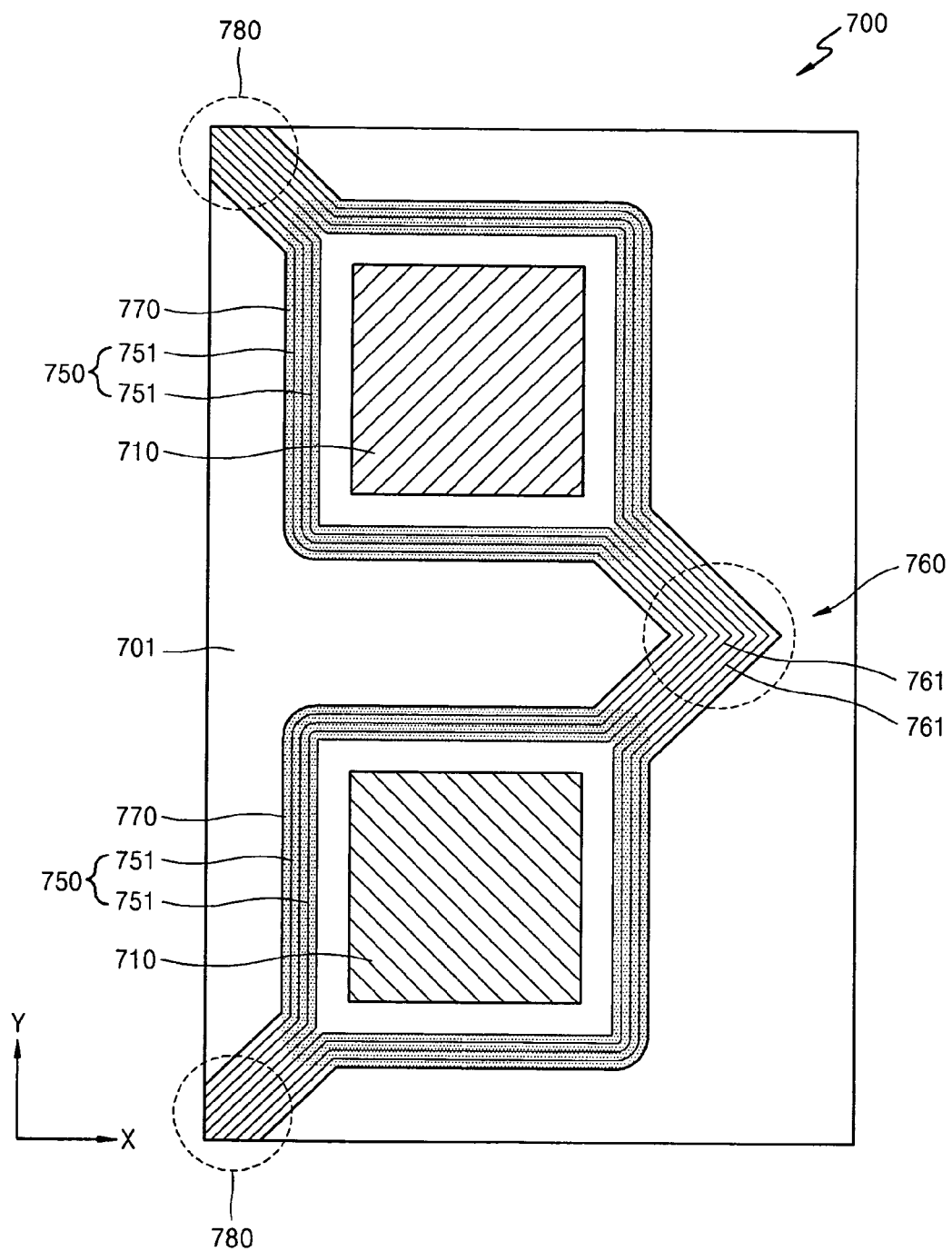
FIG. 11 illustrates a plan view of a mother substrate for flat panel display apparatuses, according to another embodiment.

FIG. 11 is a plan view of a mother substrate 700 for flat panel display apparatuses, according to another embodiment.

Referring to FIG. 11, the mother substrate 700 may include a substrate 701, a plurality of display units 710, a sealing substrate (not shown), a plurality of wiring units 750, a plurality of sealing members 770, a connection unit 760, and a lead-in unit 780.

The display units 710 may be disposed on the substrate 701. Each of the display units 710 may form a flat panel display apparatus. Since two display units 710 are illustrated in FIG. 11, two flat panel display apparatuses may be ultimately manufactured by using the mother substrate 700. However, it is to be understood that the embodiment of FIG. 11 may be modified to form more than two flat panel display apparatuses on a substrate.

The sealing substrate may be disposed to face the display units 710. The sealing members 770 may be disposed between the substrate 701 and the sealing substrate to surround the display units 710. The wiring units 750 may be formed to overlap the sealing members 770.

Each of the wiring units 750 may include a plurality of wiring members 751. The wiring members 751 may be spaced apart from each other in a region where the wiring units 750 overlap the sealing members 770. For example, the wiring members 751 may be disposed to be spaced apart from each other over the entire region where the wiring members 751 overlap the substrate.

In an implementation, the wiring members 751 of the wiring units 750 may be disposed on the substrate 701, the sealing members 770 may be disposed on and between the wiring members 751, and the sealing substrate may be disposed on the sealing members 770.

Two wiring units 750 may disposed to correspond to the display units 710, and may be aligned in one direction, e.g., the Y direction. The connection unit 760 may be disposed between neighboring wiring units 750 in the one direction (the Y direction).

The connection unit 760 may be disposed at corners of the wiring units 750 and may be bent to connect the neighboring wiring units 750. The connection unit 760 may contain a conductive material and may be formed of the same material used to form the wiring units 750. The connection unit 760 may be disposed at corners of the wiring units 750 and may be bent. Accordingly, a space required to dispose the connection unit 760 may be reduced. As such, the space of the mother substrate 700 may be efficiently used.

Also, the connection unit 760 may include a plurality of connection members 761 connected to the wiring members 751 included in each of the wiring units 750. The connection members 761 may be bent. The connection unit 760 may have a width greater than that of the wiring units 750.

The lead-in unit 780 may be formed to be connected to the wiring units 750. The lead-in unit 780 may be disposed at corners of the wiring units 750. For example, the lead-in unit 680 may include a first lead-in portion and a second lead-in portion formed at respective corners of the wiring units 750 opposite to the corners at which the connection unit 760 is attached. The lead-in unit 780 may be disposed at corners of the wiring units 750. Accordingly, a space required to dispose an external power source (not shown) for applying a voltage to form the sealing members 770 may be reduced.

The lead-in unit 780 may include a plurality of lead-in members 781 connected to the wiring members 751.

The lead-in unit 780 may be connected to the external power source. As such, a voltage may be applied to the wiring units 750 to generate heat and the sealing members 770 may be melted by the heat and then be cured.

Also, the lead-in unit 780 may have a width greater than that of the wiring units 750. As such, the amount of heat generated from the lead-in unit 780 may be similar to that generated from the wiring units 750.

Figure 12:
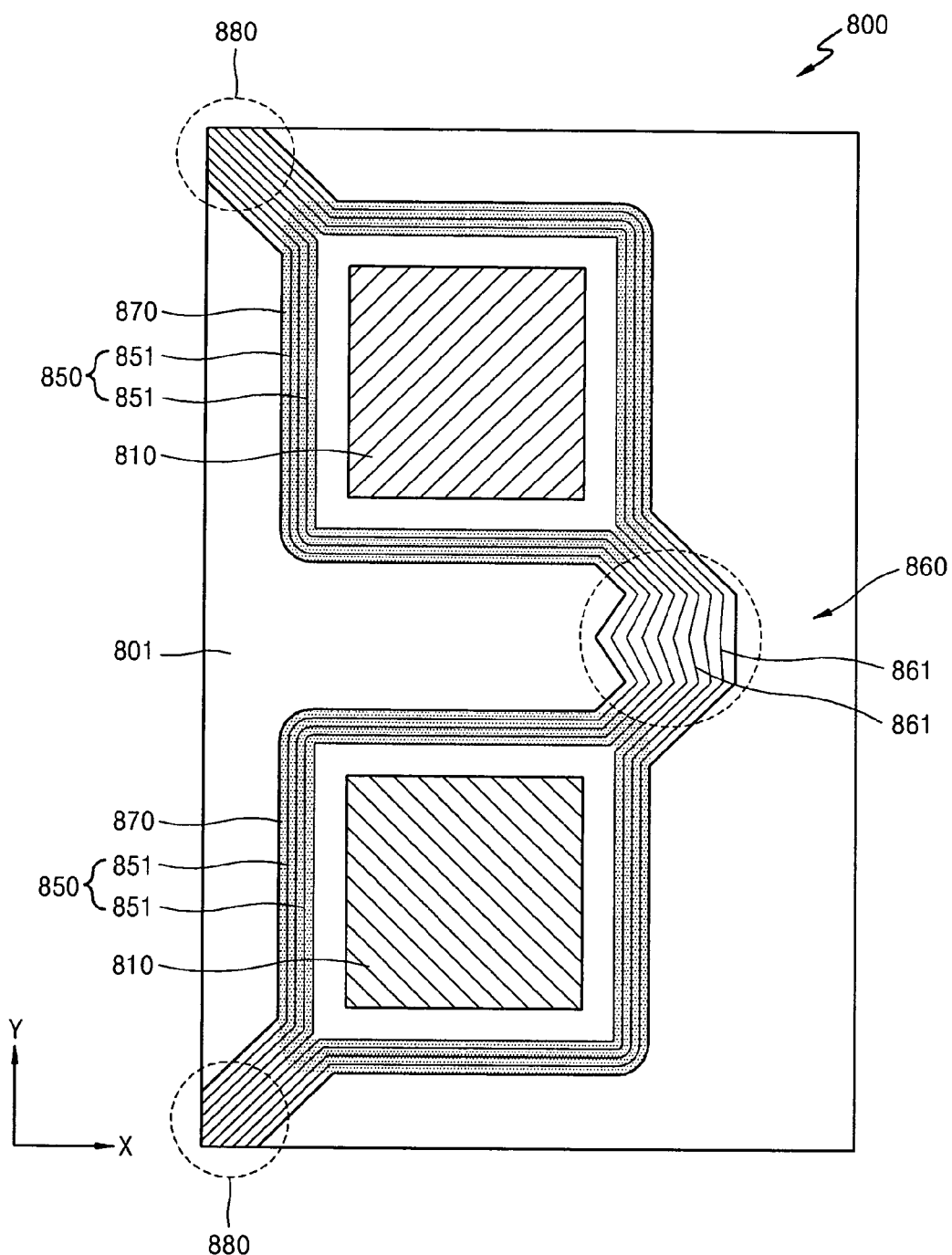
FIG. 12 illustrates a plan view of a mother substrate for flat panel display apparatuses, according to another embodiment.

FIG. 12 is a plan view of a mother substrate 800 for flat panel display apparatuses, according to another embodiment.

Referring to FIG. 12, the mother substrate 800 may include a substrate 801, a plurality of display units 810, a sealing substrate (not shown), a plurality of wiring units 850, a plurality of sealing members 870, a connection unit 860, and a lead-in unit 880.

The display units 810 may be disposed on the substrate 801. Each of the display units 810 may form a flat panel display apparatus. Since two display units 810 are illustrated in FIG. 12, two flat panel display apparatuses may be ultimately manufactured by using the mother substrate 800.

However, it is to be understood that the embodiment of FIG. 12 may be modified to form more than two flat panel display apparatuses on a substrate.

The sealing substrate may be disposed to face the display units 810. The sealing members 870 may be disposed between the substrate 801 and the sealing substrate to surround the display units 810. The wiring units 850 may be formed to overlap the sealing members 870.

Each of the wiring units 850 may include a plurality of wiring members 851. The wiring members 851 may be spaced apart from each other in a region where the wiring units 850 overlap the sealing members 870. For this, the wiring members 851 may be disposed to be spaced apart from each other over the entire region where the wiring members 851 overlap the substrate.

In more detail, the wiring members 851 of the wiring units 850 may be disposed on the substrate 801, the sealing members 870 may be disposed on and between the wiring members 851, and the sealing substrate may be disposed on the sealing members 870.

Two wiring units 850 may be disposed to correspond to the display units 810, and may be aligned in one direction, e.g., the Y direction. The connection unit 860 may be disposed between neighboring wiring units 850 in the one direction (the Y direction).

The connection unit 860 may be disposed at corners of the wiring units 850 and is bent. The connection unit 860 may connect the neighboring wiring units 850. The connection unit 860 may be disposed at corners of the wiring units 850 and may be bent. Accordingly, a space required to dispose the connection unit 860 may be reduced. As such, the space of the mother substrate 800 may be efficiently used.

Also, the connection unit 860 may include a plurality of connection members 861 connected to the wiring members 851 included in each of the wiring units 850. The connection members 861 may be bent. The connection members 861 may be connected to neighboring wiring members 851 and each connection member 861 may be configured to have the same length as each other connection member 861. As illustrated in FIG. 12, in order to achieve this result, inner connection members 861 (a left side in FIG. 12) may be bent more than outer connection members 861 (a right side in FIG. 12).

The connection members 861 may have the same length. Accordingly, when a voltage is applied to the lead-in unit 880, the connection members 861 may be configured to have the same voltage drop (IR drop). Accordingly, the same voltage may be applied to the wiring members 851 and thus the same amount of heat may be generated from the wiring members 851 to melt the sealing members 870. As such, the sealing members 870 may be evenly melted and cured.

The connection unit 860 may contain a conductive material and may be formed of the same material used to form the wiring units 850.

The connection unit 860 may have a width greater than that of the wiring units 850.

The lead-in unit 880 may be formed to be connected to the wiring units 850. The lead-in unit 880 may be disposed at corners of the wiring units 850. For example, the lead-in unit 880 may include a first lead-in portion and a second lead-in portion formed at respective corners of the wiring units 850 opposite to the corners at which the connection unit 860 is attached. The lead-in unit 880 may include a plurality of lead-in members connected to the wiring members 851.

The lead-in unit 880 may be connected to an external power source (not shown). As such, a voltage may be applied to the wiring units 850 to generate heat and the sealing members 870 may be melted by the heat and then be cured.

Also, the lead-in unit 880 may have a width greater than that of the wiring units 850. As such, the amount of heat generated from the lead-in unit 880 may be similar to that generated from the wiring units 850.

As described above, sealing characteristics of a flat panel display apparatus may be easily improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flat panel display apparatus comprising:
   a substrate;
   a display unit disposed on the substrate;
   a sealing substrate disposed to face the display unit;
   a sealing member disposed between the substrate and the sealing substrate to surround the display unit;
   a wiring unit disposed between the substrate and the sealing substrate, including a region that overlaps the sealing member; and
   a lead-in unit connected to the wiring unit to apply a voltage to the wiring unit, and formed to be electrically connectable to an external power source, the lead-in unit being directly connected to the wiring unit, wherein:
   the wiring unit forms a continuous line that overlaps the sealing member, the wiring unit including a first wiring member that surrounds the display unit, and a second wiring member that parallels the first wiring member and surrounds the display unit between the first wiring member and the display unit, the wiring unit further including a first bending region and a second bending region where respective ends of the first wiring member bend to connect to respective ends of the second wiring member to form the continuous line, wherein the first bending region and the second bending region are adjacent to each other, and
   the lead-in unit is directly connected only to the first wiring member.

2. The apparatus as claimed in claim 1, wherein the sealing member contains a frit.

3. The apparatus as claimed in claim 1, wherein the display unit includes an organic light emitting device.

4. A method of manufacturing a flat panel display apparatus, the method comprising:
   providing a substrate; a display unit disposed on the substrate; a sealing substrate disposed to face the display unit; a sealing member precursor disposed between the substrate and the sealing substrate to surround the display unit; a wiring unit disposed between the substrate and the sealing substrate, including a region that overlaps the sealing member precursor; and a lead-in unit connected to the wiring unit to a a voltage to the wiring unit and formed to be electrically connectable to an external power source, the lead-in unit being directly connected to the wiring unit; and
   forming a sealing member from the sealing member precursor by:
   electrically connecting a power source to the lead-in unit;
   applying a voltage from the power source to spaced apart wiring members of the wiring unit; and
   melting and curing the sealing member precursor using heat generated from the wiring unit, wherein:

the wiring unit forms a continuous line that overlaps the sealing member, the wiring unit including a first wiring member—that surrounds the display unit, and a second wiring member—that parallels the first wiring member—and surrounds the display unit between the first wiring member and the display unit, the wiring unit further including a first bending region and a second bending region where respective ends of the first wiring member bend to connect to respective ends of the second wiring member to form the continuous line, wherein the first bending region and the second bending region are adjacent to each other, and the lead-in unit is directly connected only to the first wiring member.

5. The method as claimed in claim 4, wherein the sealing member contains a frit.

* * * * *